(12) United States Patent
Ho

(10) Patent No.: US 7,566,225 B1
(45) Date of Patent: Jul. 28, 2009

(54) ELECTRICAL CONNECTOR ASSEMBLY

(75) Inventor: Chien-Chih Ho, Keelung (TW)

(73) Assignee: Lotes Co., Ltd., Keelung (TW)

( * ) Notice: Subject to any disclaimer, the term of this patent is extended or adjusted under 35 U.S.C. 154(b) by 0 days.

(21) Appl. No.: 11/344,083

(22) Filed: Feb. 1, 2006

(51) Int. Cl.
*H01R 13/60* (2006.01)

(52) U.S. Cl. ......................................... 439/41; 439/940

(58) Field of Classification Search ................... 439/41, 439/135, 940, 331, 342
See application file for complete search history.

(56) References Cited

U.S. PATENT DOCUMENTS

2005/0064753 A1* 3/2005 Ma ............................ 439/331

* cited by examiner

*Primary Examiner*—Tho D. Ta
(74) *Attorney, Agent, or Firm*—Guice Patents PLLC

(57) ABSTRACT

An electrical connector assembly is disclosed. The electrical connector assembly for connecting a chip module comprises: an electrical connector including an insulating main body, at least a conducting terminal, a cover body to restrain the chip module, and a rocker to restrain and secure the cover body; and a suction cover may be assembled and connected with the electrical connector, including a main body having a flat upper surface, wherein on one end of the suction cover is provided with a first fastening hook may be fastened with the electrical connector, and on the other end is provided with a second fastening hook may be fastened on the rocker. An electrical connector assembly according to the present invention can improve the shortcoming of the prior-art electrical connector assembly, which a slight change of the frame of the metal cover body may cause the suction cover unable to be disposed on the metal cover body and in turn render re-design necessary. An electrical connector assembly according to the present invention can significantly reduce the cost of design and development by enhancing the interchangeablility of the suction cover.

17 Claims, 5 Drawing Sheets

ELECTRICAL CONNECTOR ASSEMBLY

FIELD OF THE INVENTION

The present invention relates to an electrical connector assembly and particularly to an electrical connector assembly provided with a suction cover.

BACKGROUND OF THE INVENTION

At present, an electrical connector for connecting a chip module and a printed circuit board usually comprises a metal base body, a metal cover, a rocker, and an insulating main body provided with a plurality of electrical terminals therein. The metal base body of the electrical connector is a rectangular frame, in which the insulating main body is located. The electrical terminals (or the tin balls of the electrical terminals) of the insulating main body are soldered on the printed circuit board. To adapt to automatic assembly, a vacuum suction device is required to suck the electrical connector to the printed circuit board, wherein the terminals on the electrical connector are aligned with the soldering holes or electrical pieces and soldered together. Because the electrical connector is not provided with a large flat area, the electrical connector is usually provided with a suction cover to facilitate the suction of the vacuum suction device. The suction cover is disposed on the metal cover body and the suction cover is provided with a flat surface for the suction of the vacuum suction device. Because the suction cover is disposed on the metal cover body, once the frame of the metal cover body is changed slightly, the suction cover may not be able to be disposed on the metal cover body. Consequently, re-design is necessary and thus the cost is increased.

It is therefore necessary to provide a novel electrical connector assembly to overcome the shortcoming described above.

SUMMARY OF THE INVENTION

An object of the present invention is to provide an electrical connector assembly with a lower cost.

Another object of the present invention is to provide an electrical connector assembly which can prevent a slight change of the frame of the metal cover body from causing the suction cover unable to be disposed on the metal cover body. An electrical connector assembly according to the present invention can significantly reduce the cost of design and development by enhancing the interchangeablility of the suction cover.

In order to accomplish the aforementioned objects, the present invention provides an electrical connector assembly for connecting a chip module comprises: an electrical connector including an insulating main body, at least a conducting terminal, a cover body to restrain the chip module, and a rocker to restrain and secure the cover body; and a suction cover may be assembled and connected with the electrical connector, including a main body having a flat upper surface, wherein on one end of the suction cover is provided with a first fastening hook may be fastened with the electrical connector, and on the other end is provided with a second fastening hook may be fastened on the rocker.

Compared with the prior art, the present invention provides an electrical connector assembly which can prevent a slight change of the frame of the metal cover body from causing the suction cover unable to be disposed on the metal cover body, and thus enhance the interchangeablility of the suction cover

BRIEF DESCRIPTION OF THE DRAWINGS

The present invention can be more fully understood by reference to the following description and accompanying drawings, in which.

DETAILED DESCRIPTION OF THE INVENTION

Figure 1:
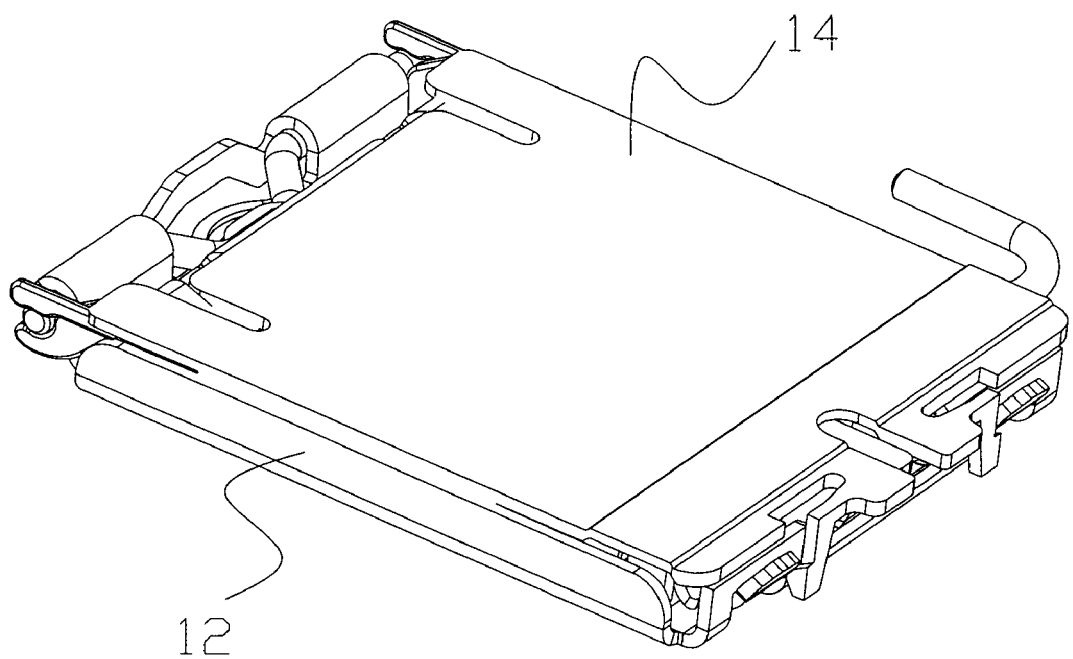
FIG. 1 is a perspective assembly view of a preferred embodiment of an electrical connector assembly according to the present invention.
Figure 2:
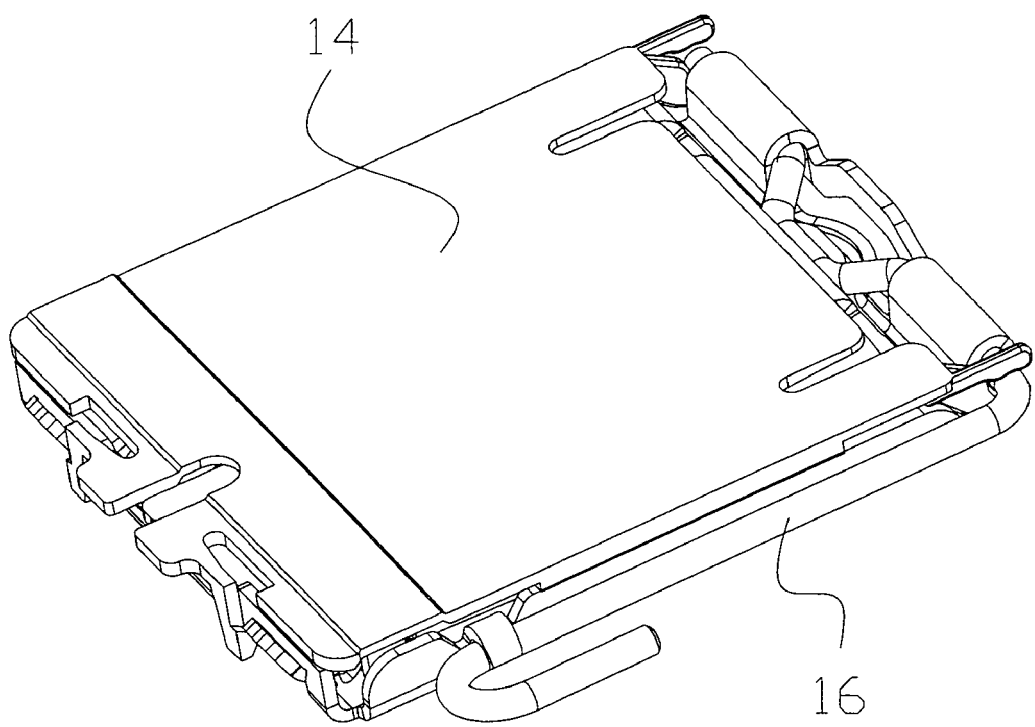
FIG. 2 is a perspective assembly view taken from another angle of FIG. 1.
Figure 3:
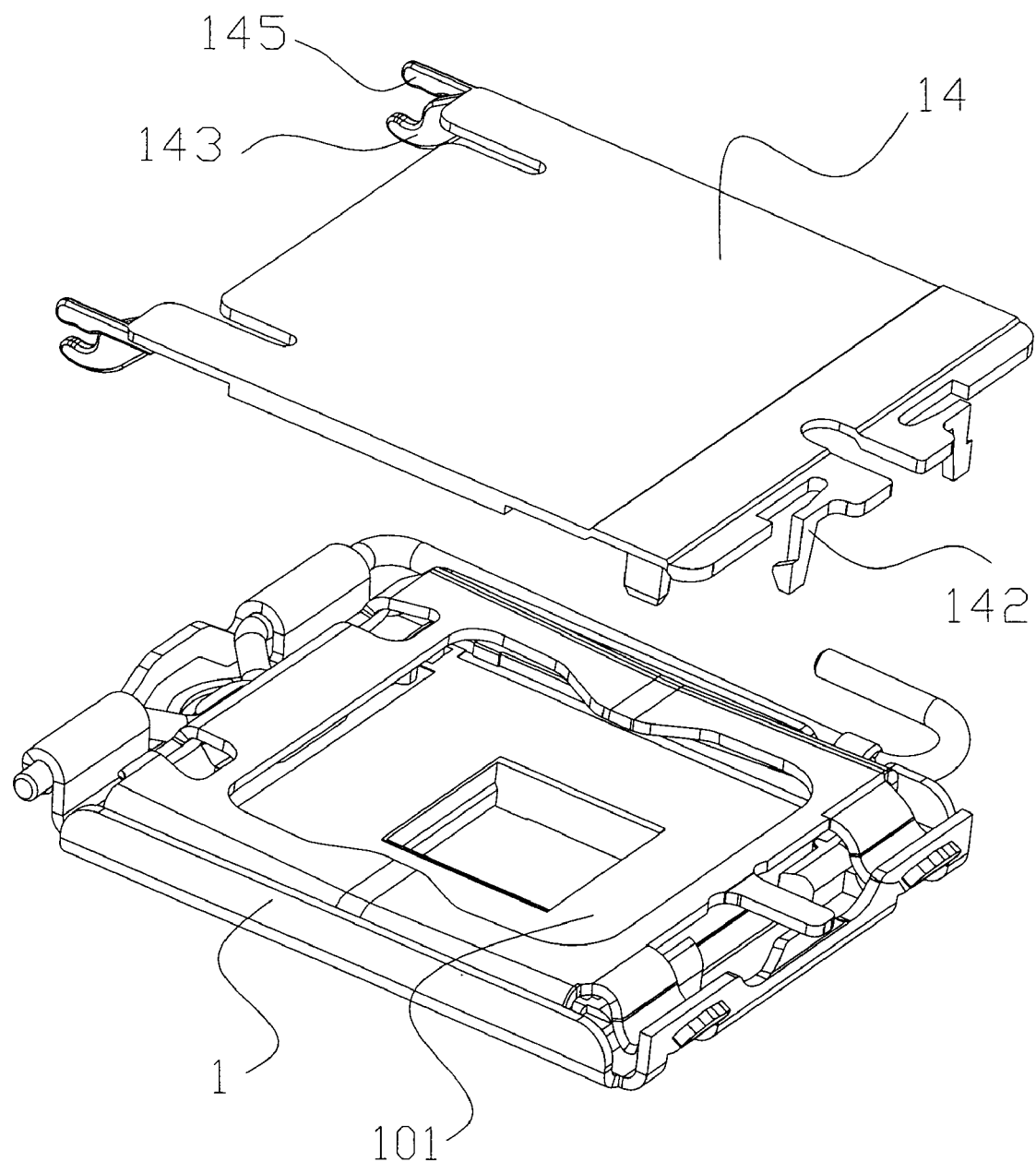
FIG. 3 is an exploded perspective view of the electrical connector 1 and the suction cover 14 of a preferred embodiment of an electrical connector assembly according to the present invention.
Figure 4:
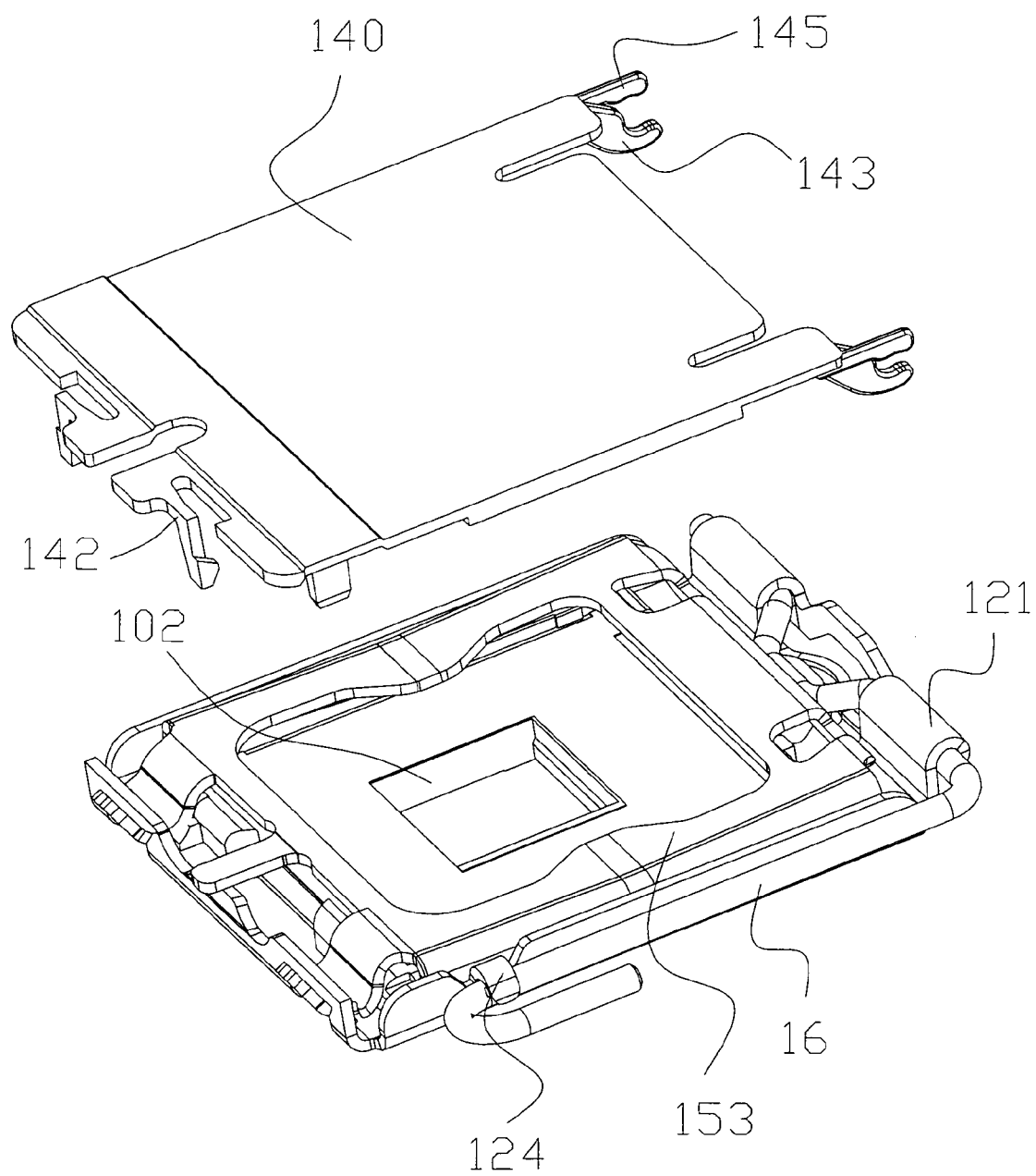
FIG. 4 is an exploded perspective view taken from another angle of FIG. 4.
Figure 5:
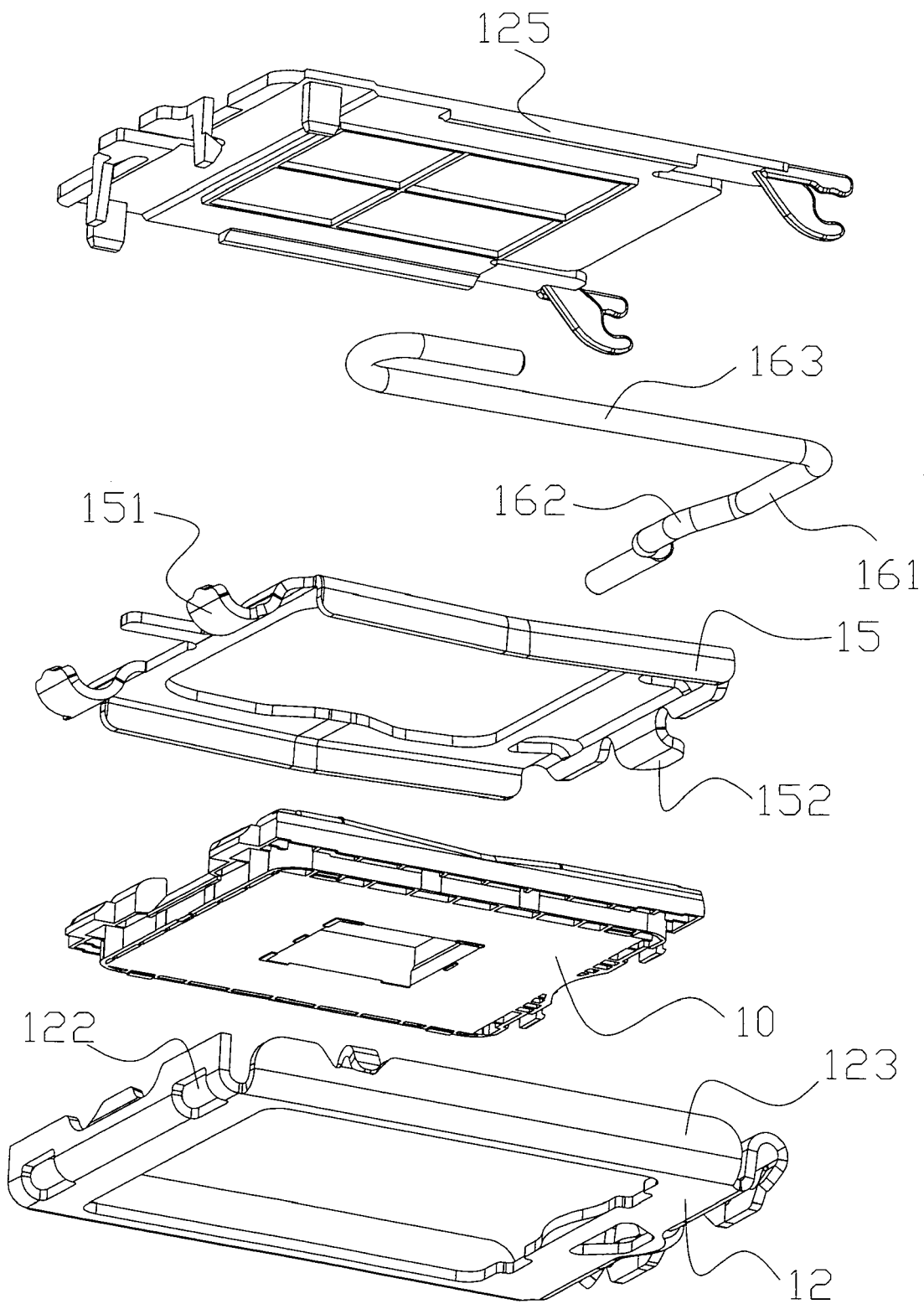
FIG. 5 is an exploded perspective view of the electrical connector 1 of a preferred embodiment of an electrical connector assembly according to the present invention.
Figure 6:
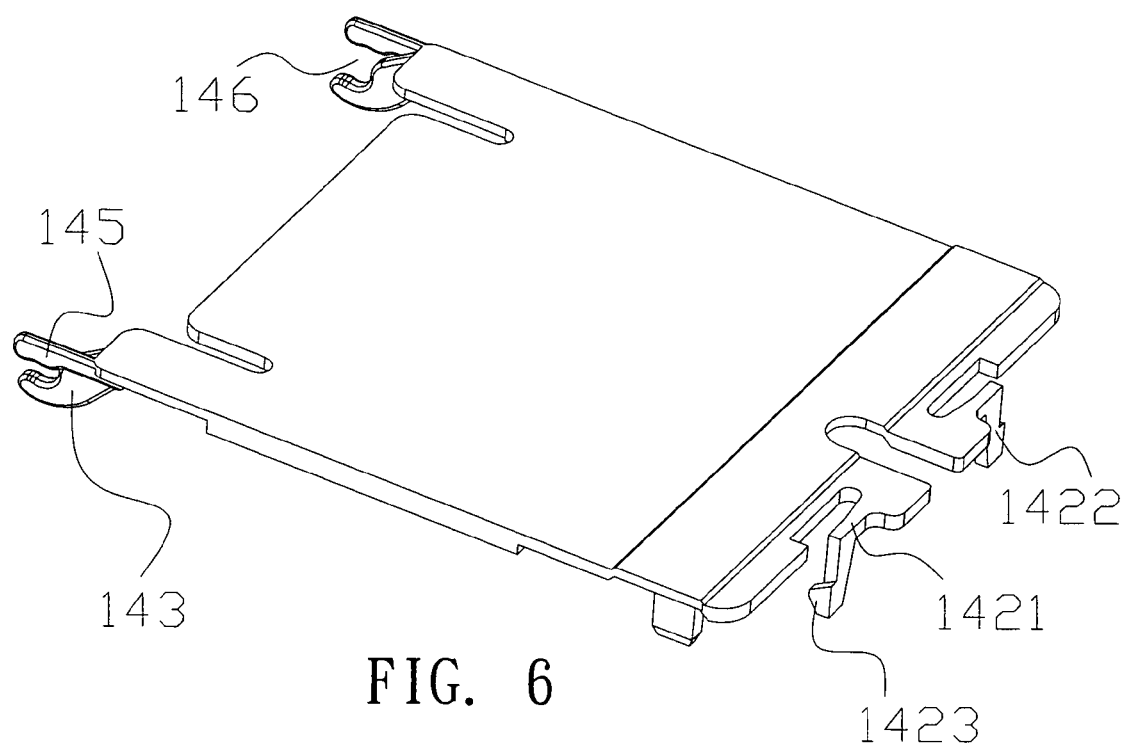
FIG. 6 is a perspective view of the suction cover 14 of a preferred embodiment of an electrical connector assembly according to the present invention.
Figure 7:
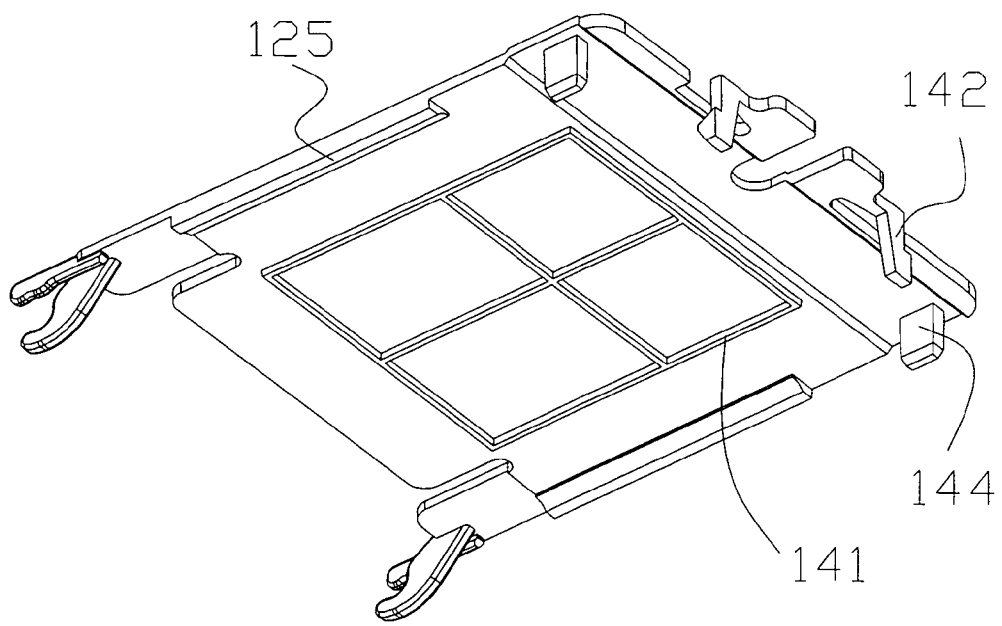
FIG. 7 is a perspective view taken from another angle of FIG. 6.

Referring to FIGS. 1 to 7, an electrical connector assembly according to the present invention for connecting a chip module (not shown) comprises an electrical connector 1 and a suction cover 14 disposed on the electrical connector 1. The electrical connector 1 comprises an insulating main body 10, conducting terminals (not shown), a retaining base 12 whose both ends are pivotally connected with a cover body 15 restraining the chip module and a rocker 16 restraining the cover body 15 on the retaining base 12, respectively.

The insulating main body 10 is provided with a receiving section 101 to accommodate the chip module (not shown). The receiving 101 is disposed with a plurality of hole (not shown) to accommodate electrical terminals (not shown). The center of the insulating main body 10 is provided with a rectangular hole 102.

The retaining base 12 is of a rectangular frame to accommodate the insulating main body 10 therein. One end of the retaining base 12 extending outwards is disposed a retaining section 121 to pivotally connect with the rocker 16. The other end of the retaining base 12, opposite to the retaining section 121, is disposed with a through groove 122 to moveably connect with the cover body 15. The through groove 122 is wider on the end connecting with the cover body 15. The other two sides of the retaining base 12, apart from those sides disposed with the retaining section 121 and the through 122, are provided with a stop wall 123, respectively. One of the stop walls 123 extending outwardly is provided with a fastener 124 which can be fastened with the rocker 14 at the close position.

The center of the cover body 15 is provided with a frame with a through hole, wherein the cover body 15 is disposed with a pivotal end 151 matched with the through groove 122 and on the other end, opposite to the pivotal end 151, extending outwards is provided with a fastening end 152. When the rocker 16 is closing, the rocker 16 will restrain the fastening end 152 onto the retaining base 12. The cover body 15 further comprises a frame 153 to restrain and secure the chip module (not shown) onto the receiving section 101 of the insulating main body 10.

The rocker 16 comprises two pivotal sections 161 pivotally connected with the retaining sections 121 of the retaining base 12, a restraining section 162 extending inwards and protrudingly from the two pivotal sections 161, and an operation section 163 extending outwards and perpendicularly from one of the pivotal sections 161.

The suction cover 14 is made of transparent materials (certainly, it can be a translucent or opaque cover and a hole is provided on the suction cover, from which at least two adjacent edges of the rectangular hole can be seen) comprising a main body 140 provided with a flat upper surface. A reinforced rib structure 141 is disposed on the lower surface of the main body 140 extending downwards. The reinforced ribs of the reinforced rib structure 141 inter-cross one another to form a shape of a square with a cross inside. The reinforced rib structure 141 is to increase the strength of the suction cover 14 to prevent it from being susceptible to deformation due to its thinness. On one end of the suction cover 14 is provided with a first fastening hook 142 may be fastened with the electrical connector 1, and on the other end is provided with a second fastening hook 143 may be fastened with the rocker 16. The first fastening hook 142 comprises an elastic arm and a hook 1423 disposed on the free end of the elastic arm protruding inwards. The elastic arm further comprises a first elastic arm 1421 extending from the main body 140 of the suction cover 14 and being in the same elevation with the main body 140 of the suction cover 14, and a second elastic arm 1422 connecting with the first elastic arm 1421 and being perpendicular to the first elastic arm 1421. The hook 1423 is situated at the free end of the second elastic arm 1422 and may be fastened with the upper edge of through groove 122 of the retaining base 12. The second fastening hook 143 is provided on the main body 140 extending downwards and outwards. A stop piece 145 extending from the main body 140 is provided on the side adjacent to the second fastening hook 143. The stop piece 145 and the second fastening hook 143 define an accommodating space 146 to accommodate the rocker 16 therein. The accommodating space 146 is approximately a circle with a narrower opening. The accommodating space 146 can be fastened with the ends of the two pivotal parts 161 of the rocker 16. Both sides of the suction cover 14 are further provided with a protrusion 125, respectively, which can press against the retaining base 12 to prevent the sucking pressure on the electrical connector 1 from getting too high. The lower surface of the suction cover 14 is disposed with a locating block 144 to locate the suction cover 14. The end of the location block 144 is a shape of wedge.

Because the first fastening hook 142 and the second fastening hook 143 are provided on both ends of the suction cover 14 extending downwards, and the first fastening hook 142 is fastened with the through groove 122 of the retaining base 12 and the second fastening hook 143 is fastened with the ends of the two pivotal parts 161 of the rocker 16, the suction cover 14 does not need to be fastened directly with the cover body 15. Therefore, an electrical connector assembly according to the present invention can prevent a slight change of the frame of the cover body (or an electrical connector without a cover body) from causing the suction cover unable to be disposed the cover body. An electrical connector assembly according to the present invention can significantly reduce the cost of design and development by enhancing the interchangeablility of the suction cover.

While the invention has been described with reference to the a preferred embodiment thereof, it is to be understood that modifications or variations may be easily made without departing from the spirit of this invention, which is defined by the appended claims.

What is claimed is:

1. An electrical connector assembly for connecting a chip module, comprising: an electrical connector including an insulating main body to accommodate the chip module, a retaining base to accommodate the insulating main body, at least a conducting terminal received in the insulating main body, a cover body to restrain the chip module, and a rocker to restrain and secure the cover body; and
    a suction cover assembled and connected with the electrical connector, including a main body having a flat upper surface to be sucked by a vacuum suction device, wherein on one end of the suction cover is provided with a first fastening hook fastened with the retaining base, and on the other end is provided with a second fastening hook fastened on the rocker.

2. The electrical connector assembly as defined in claim 1, wherein both sides of the suction cover are provided with a protrusion, respectively, to press against the retaining base.

3. The electrical connector assembly as defined in claim 1, wherein the lower surface of the suction cover is disposed with a locating block to locate the suction cover and the end of the location block is a shape of wedge.

4. The electrical connector assembly as defined in claim 1, wherein a stop piece extending from the main body is provided on the side of the suction cover adjacent to the second fastening hook, wherein the stop piece and the second fastening hook define an accommodating space to accommodate the rocker therein.

5. The electrical connector assembly as defined in claim 4, wherein the second fastening hook and the stop piece define an accommodating space to accommodate the rocker and the accommodation space is with a narrower opening.

6. The electrical connector assembly as defined in claim 4, wherein the accommodating space is approximately a circle.

7. The electrical connector assembly as defined in claim 1, wherein the first fastening hook further comprises an elastic arm and a hook disposed on the free end of the elastic arm protruding inwards.

8. The electrical connector assembly as defined in claim 7, wherein the elastic arm further comprises a first elastic arm extending from the main body of the suction cover and being in the same elevation with the main body of the suction cover, and a second elastic arm connecting with the first elastic arm and being perpendicular to the first elastic arm, the hook being situated at the free end of the second elastic arm.

9. The electrical connector assembly as defined in claim 1, wherein on one end of the retaining base extending outwards is disposed a retaining section.

10. The electrical connector assembly as defined in claim 9, wherein on one end of the retaining base, opposite to the through groove, is disposed a retaining section to pivotally connect with the rocker.

11. The electrical connector assembly as defined in claim 10, wherein the cover body is moveably connected with the through groove.

12. The electrical connector assembly as defined in claim 1, wherein a reinforced rib structure is disposed on the lower surface of the main body of the suction cover extending downwards.

13. The electrical connector assembly as defined in claim 12, wherein the reinforced ribs of the reinforced rib structure inter-cross one another to form a shape of a square with a cross inside.

14. The electrical connector assembly as defined in claim 1, wherein the suction cover is made of transparent or translucent materials.

15. The electrical connector assembly as defined in claim 14, wherein a hole is provided on the suction cover, from which at least two adjacent edges of the rectangular hole can be seen.

16. The electrical connector assembly as defined in claim 1, wherein the suction cover is made of opaque materials.

17. The electrical connector assembly as defined in claim 16, wherein a hole is provided on the suction cover, from which at least two adjacent edges of the rectangular hole can be seen.

* * * * *